(12) United States Patent (10) Patent No.: US 9,015,945 B2
Poulsen et al. (45) Date of Patent: Apr. 28, 2015

(54) METHOD OF FORMING A FLOW RESTRICTION IN A FLUID COMMUNICATION SYSTEM

(75) Inventors: Kristian Raaby Poulsen, Herning (DK); Peter Andreas Rasmussen, Soenderborg (DK)

(73) Assignee: Flowsion ApS, Nordborg (DK)

( * ) Notice: Subject to any disclaimer, the term of this patent is extended or adjusted under 35 U.S.C. 154(b) by 1055 days.

(21) Appl. No.: 13/123,050

(22) PCT Filed: Oct. 7, 2009

(86) PCT No.: PCT/DK2009/000217
§ 371 (c)(1),
(2), (4) Date: May 26, 2011

(87) PCT Pub. No.: WO2010/040354
PCT Pub. Date: Apr. 15, 2010

(65) Prior Publication Data
US 2011/0232090 A1 Sep. 29, 2011

(30) Foreign Application Priority Data

Oct. 8, 2008 (DK) ................................. 2008 01414

(51) Int. Cl.
*B23P 17/00* (2006.01)
*F16K 99/00* (2006.01)
*B81C 1/00* (2006.01)

(52) U.S. Cl.
CPC ...... *F16K 99/0001* (2013.01); *B01L 2400/0633* (2013.01); *B81B 2201/054* (2013.01); *B81C 1/00119* (2013.01); *F16K 99/0021* (2013.01)

(58) Field of Classification Search
CPC .................................................... B81C 1/00119
USPC ........ 29/890.09; 73/861.42, 861.52; 422/502, 422/503
See application file for complete search history.

(56) References Cited

U.S. PATENT DOCUMENTS

| 4,920,808 A | * | 5/1990 | Sommer ................... 73/861.42 |
| 5,178,016 A | * | 1/1993 | Dauenhauer et al. ........... 73/727 |
| 5,515,735 A | * | 5/1996 | Sarihan ..................... 73/861.47 |

(Continued)

FOREIGN PATENT DOCUMENTS

| DE | 10104323 A1 | 8/2002 |
| EP | 0866496 A1 | 9/1998 |

(Continued)

OTHER PUBLICATIONS

International Search Report for PCT/DK2009/000217 dated Feb. 10, 2010.

*Primary Examiner* — David Bryant
*Assistant Examiner* — Steven A Maynard
(74) *Attorney, Agent, or Firm* — McCormick, Paulding & Huber LLP

(57) ABSTRACT

A method of forming a flow restriction in a fluid communication system is disclosed. The method comprises the steps of providing a flow restricting section having a cross sectional area and a length, measuring the flow resistivity of the flow restricting section, and modifying the cross sectional area and/or the length of the flow restricting section until a desired flow resistivity of the flow restricting section is obtained. The method provides the possibility of forming a flow restriction in an easy and cost effective manner, and to subsequently adjust the flow resistivity of the flow restriction, thereby obtaining an accurate flow resistivity.

12 Claims, 7 Drawing Sheets

(56) References Cited

U.S. PATENT DOCUMENTS

| | | | |
|---|---|---|---|
| 7,093,483 B2* | 8/2006 | Corey et al. | 73/170.14 |
| 7,195,986 B1 | 3/2007 | Bousse et al. | |
| 7,703,339 B2* | 4/2010 | Sulouff et al. | 73/861.85 |
| 2008/0245985 A1 | 10/2008 | Heim et al. | |
| 2008/0264181 A1* | 10/2008 | Sulouff et al. | 73/861.42 |

FOREIGN PATENT DOCUMENTS

| | | |
|---|---|---|
| GB | 846002 | 8/1960 |
| WO | 2004046563 A1 | 6/2004 |
| WO | 2008009290 A1 | 1/2008 |

* cited by examiner

METHOD OF FORMING A FLOW RESTRICTION IN A FLUID COMMUNICATION SYSTEM

CROSS REFERENCE TO RELATED APPLICATIONS

This application is entitled to the benefit of and incorporates by reference essential subject matter disclosed in International Patent Application No. PCT/DK2009/000217 filed on Oct. 7, 2009 and Danish Patent Application No. PA 2008 01414 filed on Oct. 8, 2008.

FIELD OF THE INVENTION

The present invention relates to a method of forming microfluidic flow restrictions in flow systems, the flow restrictions having a correct and desired flow resistivity.

BACKGROUND OF THE INVENTION

When providing flow restrictions in flow systems it is most often desirable to ensure that the obtained flow resistivity is precise and at a desired value, since this adds to the reliability of the flow system. In microfluidic systems it is very difficult to provide flow restrictions having a precise and reliable flow resistivity, since the small dimensions of microfluidic systems increases the requirements to the manufacturing tolerances of the flow restrictions. Accordingly, it is difficult to repeatedly manufacture flow restrictions having resistivities within the same narrow limited tolerances.

An accurate flow resistivity is very desirable in flow systems where the flow rates are only allowed to vary within narrow tolerances, e.g. in flow systems which are used in health care applications, where trustworthy flow rates may be essential. Health care applications may include infusion or monitoring systems based on the principle of mixing reagents to a test sample in order to provide some detectable reaction corresponding to the parameter being monitored, such as the concentration of substances.

SUMMARY OF THE INVENTION

It is, thus, an object of the invention to provide a method of forming a flow restriction in a fluid communication system, wherein the accuracy of the flow resistivity is improved as compared to prior art methods.

It is a further object of the invention to provide a method of forming a flow restriction in a fluid communication system, wherein the manufacturing costs can be reduced as compared to prior art methods.

It is an even further object of the invention to provide a method of forming a flow restriction in a microfluidic system, wherein a high accuracy of the flow resistivity is obtained while maintaining low manufacturing costs.

According to the invention the above and other objects are fulfilled by providing a method of forming a flow restriction in a fluid communication system, the method comprising the steps of:
  providing a flow restricting section having a cross sectional area and a length,
  measuring the flow resistivity of the flow restricting section, and
  modifying the cross sectional area and/or the length of the flow restricting section until a desired flow resistivity of the flow restricting section is obtained.

In the present context the term 'fluid communication system' should be interpreted to mean a system in which a fluid, e.g. a liquid, a gas or a mixture of liquid and gas, can flow. The fluid communication system preferably comprises one or more flow channels which guide the fluid through the flow system. The fluid communication system may be or comprise a flow restrictor manifold comprising a plurality of flow restrictors.

The fluid communication system may advantageously be a microfluidic system. In the present context the term 'microfluidic system' should be interpreted to mean a flow system having dimensions which are sufficiently small to at least substantially prevent turbulence in a fluid flowing in the system.

According to the invention a flow restriction is formed in the fluid communication system. In the present context the term 'flow restriction' should be interpreted to mean a part of the fluid communication system in which the fluid flow is inhibited or restricted as compared to neighbouring parts of the fluid communication system.

When forming a flow restriction in accordance with the method of the present invention, a flow restricting section having a cross sectional area and a length is initially provided. At this stage it is not necessary to obtain an accurate flow resistivity, as will be explained further below. Therefore the flow restricting section may be formed using manufacturing techniques with relatively high tolerances, and it is therefore possible to use techniques which are cost effective, and the manufacturing costs can thereby be minimised.

Subsequently, the flow resistivity of the flow restricting section is measured. Thereby it is established whether or not a desired flow resistivity has been obtained and, possibly, how large a deviation there is between the actual flow resistivity and the desired flow resistivity.

Finally, the cross sectional area and/or the length of the flow restricting section is modified until the desired flow resistivity of the flow restricting section is obtained. Accordingly, the relatively crude flow restricting section, which was initially formed in a cost effective manner, is 'fine tuned' to precisely obtain a desired flow resistivity.

Thus, the present invention combines the use of a cost effective, but inaccurate, manufacturing method with a 'fine tuning step' providing the desired accuracy to the flow resistivity. Thereby the flow restriction can be manufactured with low manufacturing costs as well as high accuracy. This is very desirable.

The step of providing a flow restricting section may comprise forming a flow channel and providing an inlet opening and an outlet opening in fluid communication with the flow channel. The inlet opening and the outlet opening are preferably arranged in fluid communication with respective parts of the fluid communication system, the flow restricting section thereby providing fluid communication between these parts of the fluid communication system, via the inlet opening and the outlet opening. The flow channel is preferably a narrow channel, e.g. having a width within the range of 7 µm to 50 µm, such as within the range of 7 µm to 20 µm.

The step of forming a flow channel may comprise forming a groove in a substrate and covering the groove with a cover part. The groove may have any suitable shape and size, and it may be formed using any suitably technique, including laser cutting, injection moulding or embossing.

The cover part may advantageously be or comprise a foil arranged over at least the part of the substrate having the groove formed therein.

The step of providing an inlet opening and an outlet opening may be performed by forming openings in the cover part.

It should be noted that such opening should be positioned in such a manner that they provide fluid communication to the flow channel.

As an alternative, the step of providing an inlet opening and an outlet opening may be performed by forming openings in end parts of the substrate. According to this embodiment, the flow channel may extend the entire length or width of the substrate.

The channel may, in any of the embodiments described herein, have the shape of a straight line, it may be curved or follow a meandering path. It may also comprise one or more sections having any of these shapes.

According to one embodiment, the cover part may be a substrate having a groove formed therein. In this case the flow channel may advantageously be formed by joining the two substrates in such a manner that the grooves are arranged opposite each other to form a flow channel between them. The inlet opening and the outlet opening may be formed by providing opening(s) in one or both of the substrates, or they may be formed at end parts of the substrates as described above.

The step of forming a groove may comprise forming a groove having a tapered section. According to this embodiment the tapered part of the groove has a larger cross sectional area than the rest of the groove. In the case that the step of modifying the cross sectional area and/or the length of the flow restricting section is performed by removing part of the cover part at the tapered section, the changes in flow restriction is not very sensitive to small errors in removal of material.

As an alternative to forming a groove in a substrate, the step of forming a flow channel may comprise forming the flow channel directly in a base part, e.g. a substrate. In this case the flow channel may, e.g., be bored, the structure may be made directly in a 3D printer, it may be made by casting around a wire or a wax structure, which is subsequently removed/melted away, or in any other suitable manner known per se, for forming such hollow structures.

The step of modifying the cross sectional area and/or the length of the flow restricting section may comprise increasing an area covered by the inlet opening and/or an area covered by the outlet opening. This may, e.g., be done by removing material defining a wall of the flow channel. The wall may advantageously be a part of a cover arranged over a groove.

Alternatively or additionally, the step of modifying the cross sectional area and/or the length of the flow restricting section may comprise decreasing the length of the flow restricting section. When the length of a flow restricting section is decreased, the flow resistivity is also decreased. Thus, according to this embodiment, the flow restricting section is preferably initially made 'too long' and with a 'too high' flow resistivity. Subsequently, the length, and thereby the flow resistivity, is decreased in a controlled manner until the desired flow resistivity is obtained.

As an alternative, the step of modifying the cross sectional area and/or the length of the flow restricting section may comprise adding material to the channel, thereby reducing the length of the channel, removing material near the channel, e.g. in order to increase the cross sectional area of a part of the channel, and/or any other suitable step.

Alternatively or additionally, the step of providing a flow restricting section may comprise providing at least two flow channels arranged substantially in parallel and separated by a wall part, and the step of modifying the cross sectional area and/or the length of the flow restricting section may comprise removing part of the wall part. The two channels may have substantially the same cross sectional area, or they may have different cross sectional areas, thereby defining different flow resistivities. Removing a part of the wall part which separates the two parallel flow channels will provide fluid communication between the two flow channels. The length of the flow restricting section is, in this case, defined by the combined length of the fluidly connected flow channels. Removing an additional piece of the wall part decreases this length. At the same time, a wider connection channel is provided between the two flow channels. Accordingly, removing an additional piece of the wall part results in a decrease in the flow resistivity of the flow restricting section.

The step of measuring the flow resistivity may be performed by means of a pressure drop test. In this case the fluid communication system is preferably filled with a suitable fluid, e.g. a liquid or a gas, under a known pressure. The pressure drop is then measured, and the flow resistivity is calculated on the basis of this measurement.

As an alternative, the geometry of the flow restricting section may be measured, and a theoretical value of the flow resistivity may be calculated on the basis of this measurement.

BRIEF DESCRIPTION OF THE DRAWINGS

The invention will now be described in further detail with reference to the accompanying drawings in which.

DETAILED DESCRIPTION OF THE PREFERRED EMBODIMENT

Figure 1:
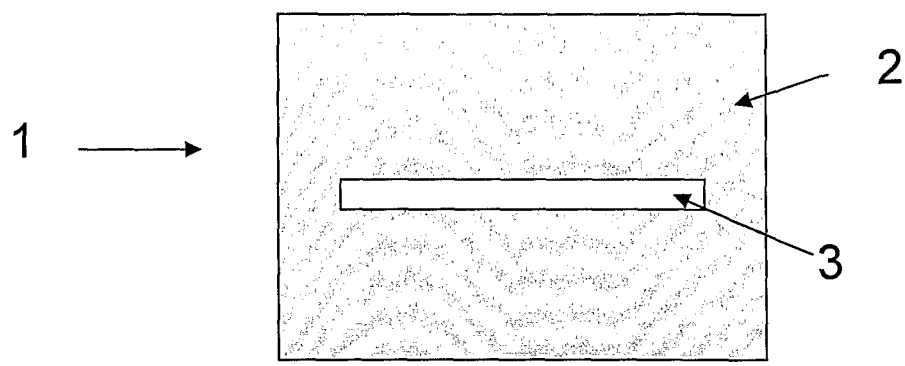
FIGS. 1-3 illustrate formation of a flow restriction by means of a method according to a first embodiment of the invention.

FIG. 1 is a schematic view of a flow restriction system 1 comprising a base element in the form of a substrate 2. In a substantially planar surface of the substrate 2 a groove 3 is formed.

Figure 2:
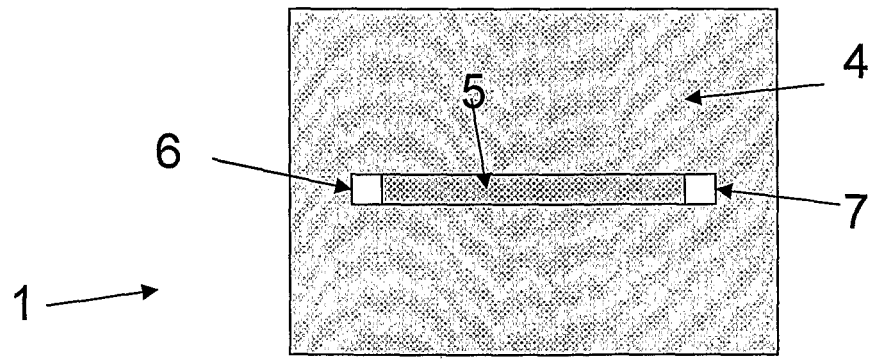

FIG. 2 shows the flow restriction system 1 of FIG. 1. In FIG. 2 a cover element 4 has been arranged along the substantially planar surface of the substrate 2. The cover element 4 and the groove 3 in combination form a channel 5. The channel 5 forms a flow restriction.

An inlet opening 6 and an outlet opening 7 are formed in the cover element 4. The outlet opening 6 and the inlet opening 7 are in the form of through-going bores in the cover element 4, and they are arranged at positions which allow fluid communication to and from the channel 5, through the cover element 4.

Figure 3:
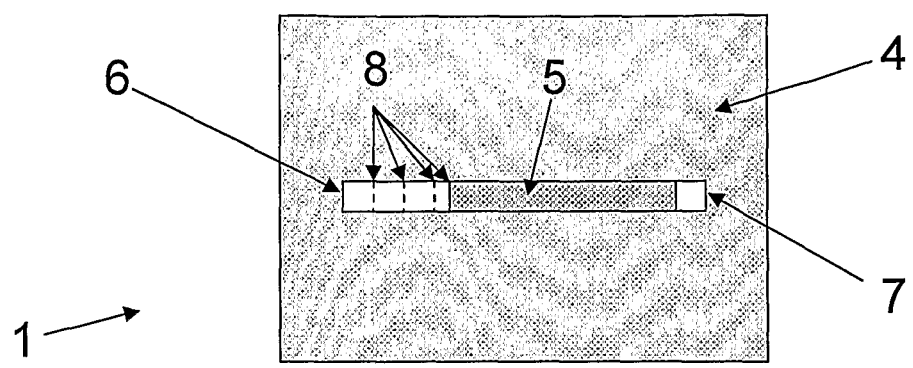

FIG. 3 shows the flow restriction system 1 of FIGS. 1 and 2. In FIG. 3 part of the cover element 4 has been removed adjacent to the inlet opening 6. Thereby the area of the inlet opening 6 has been increased, and the length of the channel 5 has been decreased. The decreased length of the channel 5 results in a decreased flow resistivity of the channel 5, i.e. the flow resistivity is thereby adjusted. This has been performed in four steps, illustrated by the four dotted lines 8.

Thus, in the process illustrated in FIGS. 1-3, a flow restrictor is formed by initially forming the channel 5 by forming the groove 3 in the surface of the substrate 2, covering the groove 3 by the cover element 4 and forming the inlet opening 6 and the outlet opening 7 in the cover element 4. This procedure is easily performed, but the flow resistivity of the flow restrictor is inaccurate. In order to obtain a desired flow resistivity of the flow restrictor, part of the cover element 4 is removed as illustrated in FIG. 3, while measuring the flow resistivity of the flow restrictor. Accordingly, the flow restrictor can be manufactured in an easy and cost effective manner, and with an accurate, desired flow resistivity.

Figure 4:
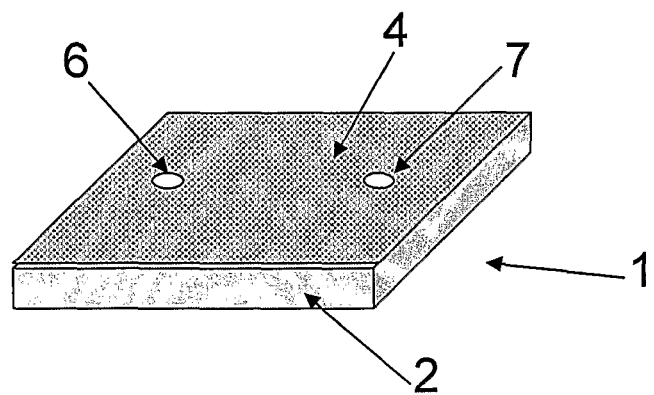
FIG. 4 is a perspective view of the flow restriction illustrated in FIGS. 1-3.

FIG. 4 is a perspective view of the flow restrictor system 1 of FIGS. 1-3.

Figure 5:
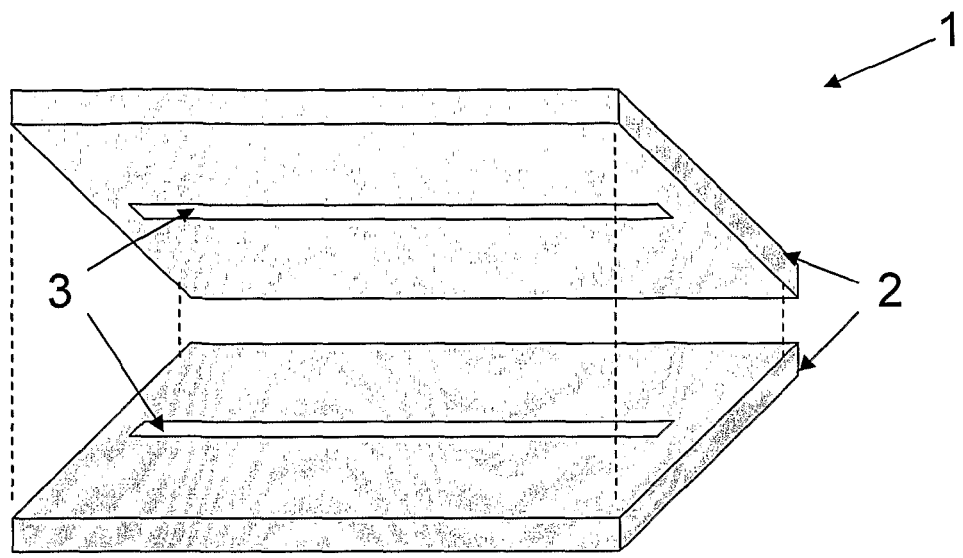
FIG. 5 shows a flow restriction formed by means of a method according to a second embodiment of the invention.

FIG. 5 is a perspective view of a flow restrictor system 1 formed by means of a method according to a second embodiment of the invention. The flow restrictor system 1 of FIG. 5 comprises two substrates 2, each having a groove 3 formed in a substantially planar surface thereof. The substrates 2 are then joined together in such a manner that the grooves 3 are arranged opposite to each other, thereby forming a channel. An inlet opening and an outlet opening (not shown) are formed in one of the substrates 2. Subsequently, material is removed adjacent to the inlet opening and/or adjacent to the outlet opening, thereby decreasing the length of the channel and decreasing the flow resistivity of the flow restrictor, until a desired flow resistivity is obtained.

Figure 6:
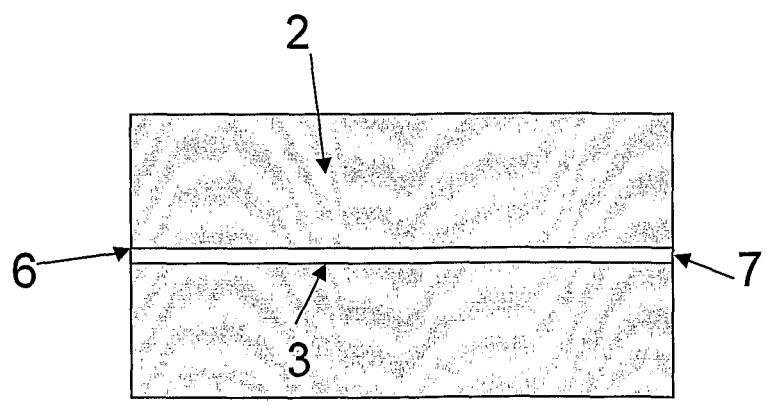
FIG. 6 shows a flow restriction formed by means of a method according to a third embodiment of the invention.

FIG. 6 shows a substrate 2 having a groove 3 formed in a substantially planar surface thereof. The groove 3 extends the entire width of the substrate 2. Accordingly, an inlet opening 6 is formed at one end part of the substrate 2, and an outlet opening 7 is formed at an opposite end part of the substrate 2. The substrate of FIG. 6 may subsequently be covered by a cover element, thereby forming a channel at a position corresponding to the position of the groove 3, similar to the situation described above with reference to FIG. 2. Thereby a flow restrictor with an inaccurate flow resistivity is formed. In order to adjust the flow resistivity of the flow restrictor, part of the cover element adjacent to the inlet opening 6 and/or adjacent to the outlet opening 7 can be removed, thereby reducing the length of the channel and, consequently, decreasing the flow resistivity of the flow restrictor.

Figure 7:
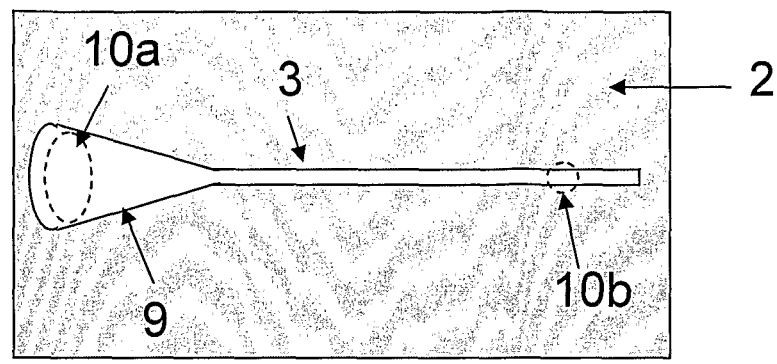
FIG. 7 shows a flow restriction formed by means of a method according to a fourth embodiment of the invention.

FIG. 7 shows a substrate 2 having a groove 3 formed in a substantially planar surface thereof. The groove 3 has a tapered portion 9 arranged at an end part of the groove 3. As described above with reference to FIGS. 2 and 3, the surface of the substrate 2 may be covered by a cover element having an inlet opening and an outlet opening formed therein, in order to form a flow restrictor in the form of a channel. If part of the cover element is subsequently removed in a region 10a, the resulting changes in flow resistivity will be less sensitive to small errors in the removal of material than would be the case if material is removed in a region 10b. Thus, using the substrate 2 of FIG. 7 makes it easier to perform fine tuning to the flow resistivity.

Figure 8A:
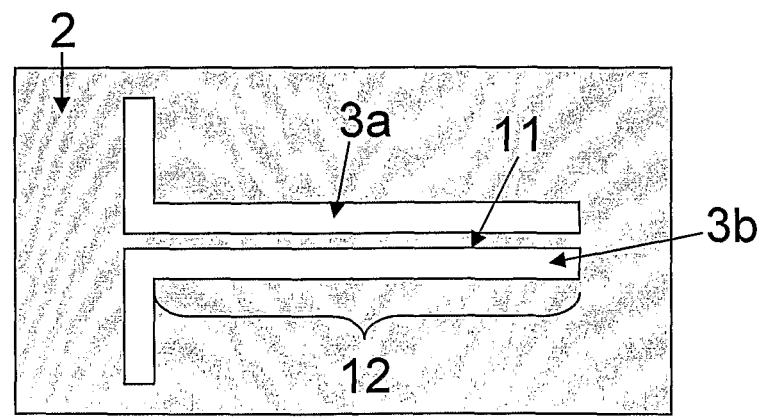
FIGS. 8A-8C illustrate formation of a flow restriction by means of a method according to a fifth embodiment of the invention.
Figure 8B:
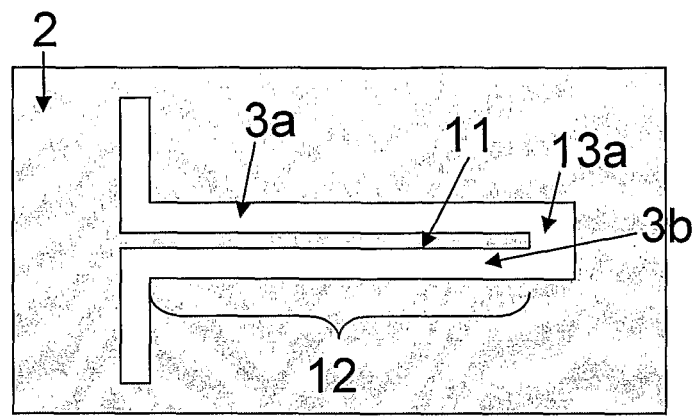
Figure 8C:
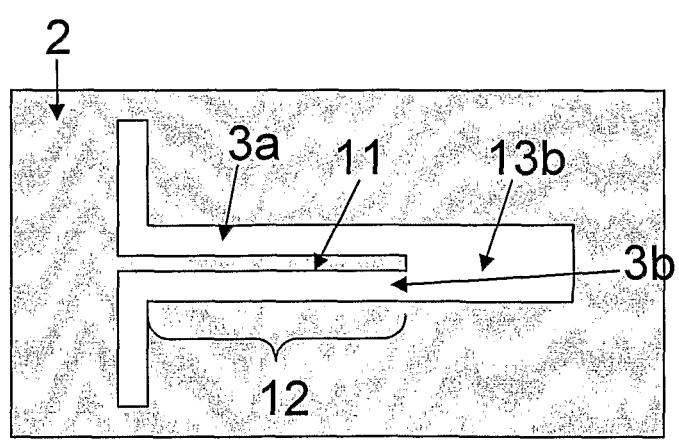

FIGS. 8A-8C illustrate a fifth embodiment of the method of the invention. According to this embodiment the groove is split into two grooves 3a, 3b arranged in parallel with a separating wall 11 there between. The parallel section of the grooves 3a, 3b defines a length 12. In FIG. 8A the grooves 3a, 3b are completely separated.

In FIG. 8B a part 13a of the separating wall 11 has been removed, thereby forming a passage between the grooves 3a, 3b and decreasing the length 12. As a consequence, the flow resistivity of the flow restrictor is decreased.

In FIG. 8C a larger part 13b of the separating wall 11 has been removed. Thereby the length 12, as well as the flow resistivity of the flow restrictor, has been further decreased.

Thus, according to the method illustrated in FIGS. 8A-8C, the flow resistivity is adjusted by removing a part of the separating wall 11, thereby reducing the length 12.

Figure 9:
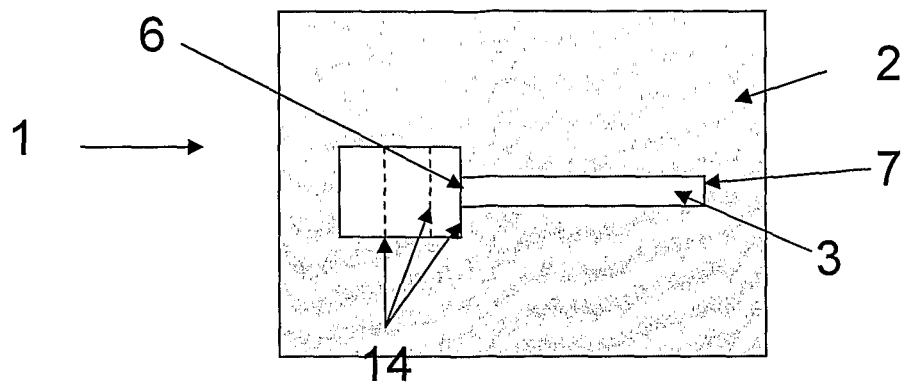
FIG. 9 shows a flow restriction formed by means of a method according to a sixth embodiment of the invention.

FIG. 9 shows a substrate 2 in which a groove 3 has been formed. Subsequently, material has been removed from the substrate 2 in the region near the inlet opening 6. Accordingly, the cross sectional area of the groove 3 has been increased in this area. As a consequence, the flow resistivity of the channel which is formed when a cover element is attached to the substrate 2 is decreased. Material has been removed in three steps, illustrated by the dotted lines 14. When removing material from the substrate 2, a temporary cover is preferably attached to the substrate 2 in order to form a channel. Thereby it is possible to measure the flow resistivity of the channel during the steps of removing material. When the 'fine tuning step' has been completed, the temporary cover is removed and replaced by a permanent cover element.

Figure 10:
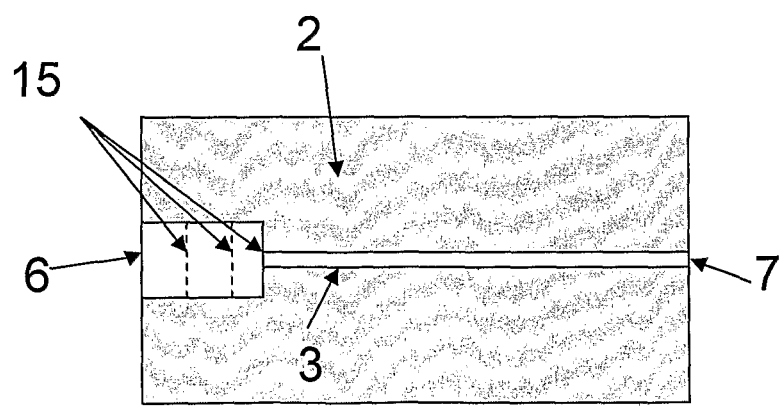
FIG. 10 shows a flow restriction formed by means of a method according to a seventh embodiment of the invention.

FIG. 10 shows a substrate 2 having a groove 3 formed therein. Similarly to the embodiment shown in FIG. 6 the groove 3 extends the entire width of the substrate 2, and the inlet opening 6 is formed at one end part of the substrate 2, and the outlet opening 7 is formed at an opposite end part of the substrate 2. In the embodiment of FIG. 10 the flow resistivity of the channel, which is formed when the groove 3 is subsequently covered by a cover element, is adjusted by removing material from the substrate 2 in a region near the inlet opening 6. Since the inlet opening 6 is formed in an end part of the substrate 2, the material may be removed by boring into the end part of the substrate 2. Material has been removed in three steps, illustrated by the dotted lines 15.

It should be noted that the substrate 2 could be substituted by another suitable kind of base part, which could, e.g., be in the form of a glass capillary tube wherein the inlet opening 6 and/or the outlet opening 7 is/are shaped by means of a boring technique or similar technique.

Figure 11:
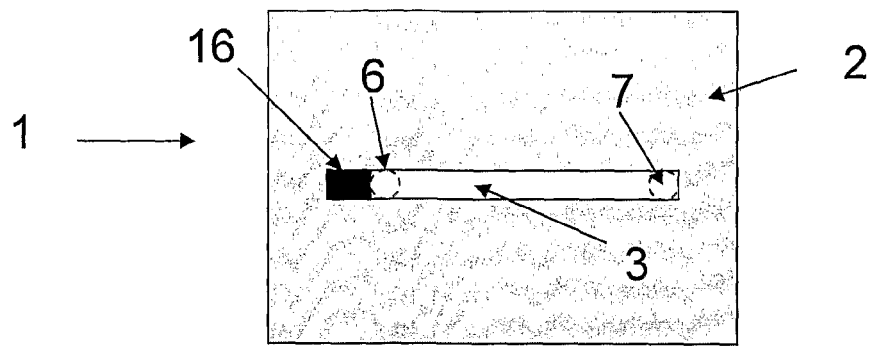
FIG. 11 shows a flow restriction formed by means of a method according to an eighth embodiment of the invention.

FIG. 11 shows a substrate 2 having a groove 3 formed therein. An inlet opening 6 and an outlet opening 7 are formed in a cover element (not shown) attached to the substrate 2. The flow resistivity of the channel formed by the groove 3 and the cover element has been adjusted by adding material 16 to the groove 3, thereby decreasing the length of the channel, and thereby the flow resistivity. According to this embodiment, a temporary cover may advantageously be mounted on the substrate 2 during adjustment of the flow resistivity, since this allows the flow resistivity of the channel to be measured. When the desired flow resistivity has been obtained, the temporary cover is removed and replaced by a permanent cover element. The inlet opening 6 and the outlet opening 7 are formed in the cover element at positions which correspond to the end parts of the groove 3 after the material 16 has been added to the groove 3.

Figure 12:
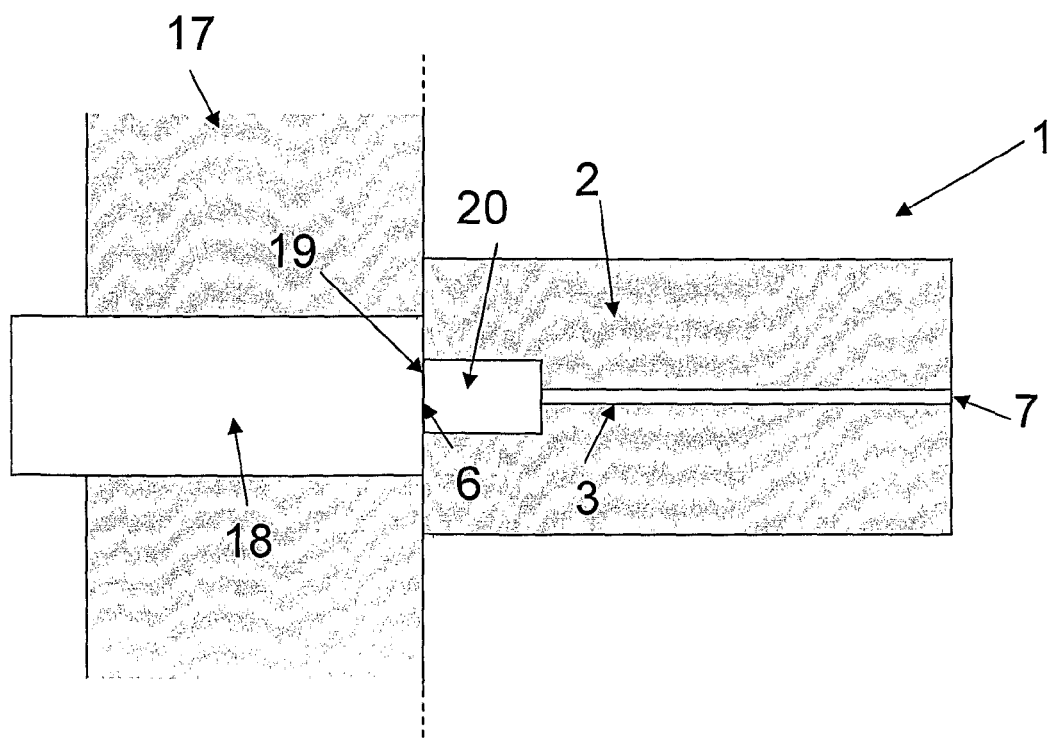
FIG. 12 shows a fluid communication system comprising the flow restrictor of FIG. 10.

FIG. 12 shows a fluid communication system comprising the flow restrictor system 1 of FIG. 10. A microfluidic system 17 comprising a flow channel 18 is arranged adjacent to the flow restrictor system 1 in such a manner that the position of an outlet opening 19 of the flow channel 18 matches the position of the calibrated section 20 of the inlet opening 6 of the flow restrictor system 1. Accordingly, fluid is allowed to flow from the flow channel 18 into the channel formed by the groove 3, via the outlet opening 19 and the calibrated section 20.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A method of forming a flow restriction in a fluid communication system, the method comprising the steps of:
providing a flow restricting section having a cross sectional area and a length,
measuring the flow resistivity of the flow restricting section, and
modifying the cross sectional area and/or the length of the flow restricting section by removing material defining a wall of the flow restricting section until a desired flow resistivity of the flow restricting section is obtained.

2. The method according to claim 1, wherein the step of providing a flow restricting section comprises forming a flow channel and providing an inlet opening and an outlet opening in fluid communication with the flow channel.

3. The method according to claim 2, wherein the step of forming a flow channel comprises forming a groove in a substrate and covering the groove with a cover part.

4. The method according to claim 3, wherein the step of providing an inlet opening and an outlet opening is performed by forming openings in the cover part.

5. The method according to claim 3, wherein the step of providing an inlet opening and an outlet opening is performed by forming openings in end parts of the substrate.

6. The method according to claim 3, wherein the cover part is a substrate having a groove formed therein.

7. The method according to claim 3, wherein the step of forming a groove comprises forming a groove having a tapered section.

8. The method according to claim 2, wherein the step of modifying the cross sectional area and/or the length of the flow restricting section comprises increasing an area covered by the inlet opening and/or an area covered by the outlet opening.

9. The method according to claim 8, wherein the step of increasing an area covered by the inlet opening and/or an area covered by the outlet opening comprises removing material defining a wall of the flow channel.

10. The method according to claim 1, wherein the step of modifying the cross sectional area and/or the length of the flow restricting section comprises decreasing the length of the flow restricting section.

11. The method according to claim 1, wherein the step of providing a flow restricting section comprises providing at least two flow channels arranged substantially in parallel and separated by a wall part, and wherein the step of modifying the cross sectional area and/or the length of the flow restricting section comprises removing part of the wall part.

12. The method according to claim 1, wherein the step of measuring the flow resistivity is performed by means of a pressure drop test.

* * * * *